United States Patent
Beach

(10) Patent No.: US 7,279,697 B2
(45) Date of Patent: Oct. 9, 2007

(54) FIELD EFFECT TRANSISTOR WITH ENHANCED INSULATOR STRUCTURE

(75) Inventor: Robert Beach, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 277 days.

(21) Appl. No.: 11/004,187

(22) Filed: Dec. 3, 2004

(65) Prior Publication Data

US 2005/0121661 A1    Jun. 9, 2005

Related U.S. Application Data

(60) Provisional application No. 60/527,631, filed on Dec. 5, 2003.

(51) Int. Cl.
| H01L 29/06 | (2006.01) |
| H01L 29/12 | (2006.01) |
| H01L 31/0328 | (2006.01) |
| H01L 31/0336 | (2006.01) |
| H01L 31/072 | (2006.01) |

(52) U.S. Cl. ............................ 257/11; 257/12; 257/20; 257/24; 257/27; 257/189; 257/190; 257/194; 257/195

(58) Field of Classification Search ............ 257/11–12, 257/20, 24, 27, 189–190, 194–195, 201
See application file for complete search history.

(56) References Cited

U.S. PATENT DOCUMENTS

| 5,192,987 | A | * | 3/1993 | Khan et al. ............... 257/183.1 |
| 5,322,808 | A | | 6/1994 | Brown et al. ................ 117/105 |
| 5,359,220 | A | * | 10/1994 | Larson et al. ................ 257/378 |
| 5,856,217 | A | * | 1/1999 | Nguyen et al. ............. 438/172 |
| 6,764,871 | B2 | * | 7/2004 | Kawaguchi et al. .......... 438/46 |
| 6,849,882 | B2 | * | 2/2005 | Chavarkar et al. .......... 257/191 |
| 6,903,364 | B1 | * | 6/2005 | Takayama et al. ............ 257/12 |
| 7,026,665 | B1 | * | 4/2006 | Smart et al. ................. 257/190 |

(Continued)

FOREIGN PATENT DOCUMENTS

TW    417251    1/2001

(Continued)

OTHER PUBLICATIONS

Office Action issued May 17, 2007 from the Taiwanese Patent Office in corresponding Taiwanese Application No. 93137383.

*Primary Examiner*—Ida M. Soward
(74) *Attorney, Agent, or Firm*—Ostrolenk, Faber, Gerb & Soffen, LLP

(57) ABSTRACT

A III-nitride based field effect transistor obtains improved performance characteristics through manipulation of the relationship between the in-plane lattice constant of the interface of material layers. A high mobility two dimensional electron gas generated at the interface of the III-nitride materials permits high current conduction with low ON resistance, and is controllable through the manipulation of spontaneous polarization fields obtained according to the characteristics of the III-nitride material. The field effect transistor produced can be made to be a nominally on device where the in-plane lattice constants of the material forming the interface match. A nominally off device may be produced where one of the material layers has an in-plane lattice constant that is larger than that of the other layer material. The layer materials are preferably InAlGaN/GaN layers that are particularly tailored to the characteristics of the present invention.

16 Claims, 3 Drawing Sheets

U.S. PATENT DOCUMENTS

| | | | |
|---|---|---|---|
| 7,030,428 B2* | 4/2006 | Saxler | 257/194 |
| 2002/0139995 A1* | 10/2002 | Inoue et al. | 257/194 |
| 2002/0167023 A1* | 11/2002 | Chavarkar et al. | 257/194 |
| 2003/0080347 A1 | 5/2003 | Lee et al. | 257/172 |
| 2006/0237745 A1* | 10/2006 | Munns | 257/190 |

FOREIGN PATENT DOCUMENTS

| | | |
|---|---|---|
| TW | 474024 | 1/2002 |
| TW | 523927 | 3/2003 |

* cited by examiner

FIELD EFFECT TRANSISTOR WITH ENHANCED INSULATOR STRUCTURE

CROSS-REFERENCE TO RELATED APPLICATION

The present application is based on and claims benefit of U.S. Provisional Application No. 60/527,631 filed Dec. 5, 2003, entitled InAlGaN FET With Enhanced Insulator Structure, to which a claim of priority is hereby made.

BACKGROUND OF THE INVENTION

1. Field of the Invention

The present invention relates generally to a class of field effect transistors based on III-nitride materials, and relates more particularly to a field effect transistor that uses spontaneous polarization fields to provide enhanced conductivity while providing improved electrical insulation under the gate structure.

2. Description of Related Art

Development of devices based on III-nitride materials has generally been aimed at high power-high frequency applications such as emitters for cell phone base stations. The devices fabricated for these types of applications are based on general device structures that exhibit high electron mobility and are referred to variously as heterojunction field effect transistors (HFETs), high electron mobility transistors (HEMTs) or modulation doped field effect transistors (MODFETs). These types of devices are typically able to withstand high voltages such as in the range of 100 Volts, while operating at high frequencies, typically in the range of 2-100 GHz. These types of devices may be modified for a number of types of applications, but typically operate through the use of piezoelectric polarization fields to generate a two dimensional electron gas (2DEG) that allows transport of very high current densities with very low resistive losses. The 2DEG is formed at an interface of AlGaN and GaN materials in these conventional III-nitride HFETs. However, a drawback of these types of devices is the limited thickness that can be achieved in the strained AlGaN/GaN system. The difference in the lattice structure of these types of materials produces a strain that can result in dislocation of films grown to produce the different layers. This results in high levels of leakage through a barrier layer, for example. The addition of an insulator layer can reduce the leakage through the barrier, and typical layers used for this purpose are silicon oxide, silicon nitride, sapphire, or other insulators, disposed between the AlGaN and metal gate layers. This type of device is often referred to as a MISHFET and has some advantages over the traditional devices that do not have an insulator layer. However, there are several drawbacks to this type of design. First, the additional interface between the AlGaN layer and the insulator results in the production of interface trap states that slow the response of the device. Second, the additional thickness of the oxide, plus the additional interfaces between the two layers, results in the use of larger gate drive voltages to switch the device.

Conventional device designs using nitride material to obtain nominally off devices rely on this additional insulator to act as a confinement layer, and reduce or eliminate the top AlGaN layer. These devices, however, typically have lower current carrying capacity due to scattering at the GaN/insulator interface.

Accordingly, it would be desirable to produce an HFET switching device that has a low leakage characteristic with fewer interfaces and layers that can still produce high current densities with low resistive losses. Presently, planar devices have been fabricated with GaN and InAlGaN alloys through a number of techniques, including MOCVD (metal organic chemical vapor deposition) as well as molecular beam epitaxy (MBE) and hydride vapor phase epitaxy (HVPE).

Materials in the gallium nitride material system may include gallium nitride (GaN) and its alloys such as aluminum gallium nitride (AlGaN), indium gallium nitride (InGaN) and indium aluminum gallium nitride (InAlGaN). These materials are semiconductor compounds that have a relatively wide direct bandgap that permits highly energetic electronic transitions to occur. Gallium nitride materials have been formed on a number of different substrates including silicon carbide (SiC), sapphire and silicon. Silicon substrates are readily available and relatively inexpensive, and silicon processing technology has been well developed. However, forming gallium nitride materials on silicon substrates to produce semiconductor devices presents challenges that arise from differences in the lattice constant, thermal expansion and bandgap between silicon and gallium nitride. Differences in the properties between gallium nitride materials and substrates can lead to difficulties in growing layers suitable for many applications. For example, GaN has a different thermal expansion coefficient, i.e., thermal expansion rate, than many substrate materials including saphire, SiC and silicon. The thermal expansion differences can lead to cracking of the GaN layer deposited on such substrates when the structure is cool, for example during processing. GaN also has a different lattice structure than most substrate materials. The difference in lattice constant may lead to the formation of defects in gallium nitride material layers deposited on substrates. Such defects can impair the performance of devices formed using the gallium nitride material layers.

The problems attendant with the lattice mismatch between GaN and traditional substrate materials are also prevalent in material layer structures involving GaN and GaN alloys. For example, GaN and AlGaN materials have lattice structures that differ significantly enough to produce interface strain between the layers. This strain contributes to the piezoelectric polarization that in turn produces the high levels of electron charge at the interface, resulting in high current carrying capacity. In many previous devices, the fields generated by the piezoelectric polarization are maximized through increasing the strain to improve the characteristics of the devices. However, increasing the strain by increasing the content of aluminum in the AlGaN/GaN layer structures causes the same detrimental effects as the strain and lattice mismatch associated with growth of GaN on the variety of substrates mentioned above, including defect generation and cracking. For example, a major drawback of the use of high strain AlGaN/GaN materials in tradition III-nitride HFETs to permit high current densities with low resistive losses is the limited thickness that can be achieved in constructing the strained AlGaN/GaN system. The strain results in dislocation generation during film growth and results in high levels of leakage through the barrier layer. While additional insulator layers can permit thicker strained AlGaN/GaN systems to be constructed, the confinement layer produced by the additional insulator results in higher threshold voltages and switching losses due to the higher voltage required to turn the devices off.

Accordingly, it would be desirable to produce a III-nitride material field effect device with greater current carrying capacity, while being operable to withstand high voltages and reduce or practically eliminate gate leakage.

SUMMARY OF THE INVENTION

In accordance with the present invention, there is provided a class of devices and methods for operating particular devices that reduce or eliminate strain generated fields and incorporate spontaneous polarization fields in the III-nitride material system. The device is composed of layers of gallium nitride material, such as InAlGaN grown on GaN, such that the in-plane lattice constant of the InAlGaN is substantially the same as, or is much larger than, for nominally off devices, that of GaN. This technique takes advantage of a relatively unused characteristic of gallium nitride material involving spontaneous polarization fields, where previous devices focus on the development of piezoelectric polarization fields to obtain a high density 2DEG.

The device according to the present invention is operable with two primary layers. The first layer is a base layer composed of a III-nitride material with a lattice constant A and a bandgap Eb, typically GaN. The second layer on top of the first layer is another composition of III-nitride material with lattice constant B and bandgap Et, typically InAlGaN. One defining character of the device and the material composition is that Et is greater than Eb, and that B is greater than or equal to A. By arranging the layer characteristics accordingly, a nominally on or nominally off device is provided with high current carrying capabilities and low on resistance.

Advantageously, cladding and contact layers may be grown above or below this two-layer active region.

The device according to the present invention obtains spontaneous polarization fields to produce and control a high-density 2DEG at the GaN/InAlGaN interface. Control of the density of the 2DEG can be accomplished by varying the alloy percentage of In to Al. The interplay of spontaneous and piezoelectric fields leads to unique attributes for this design. In particular, spontaneous polarization and piezoelectric polarization can be balanced to cancel each other, leading to zero charge accumulation at the interface. This results in nominally off HFET devices.

Conventional device designs using nitride material to obtain nominally off devices rely on an additional insulator to act as a confinement layer. These devices, however, typically have lower current carrying capacity due to scattering at the GaN/insulator interface. The present invention takes advantage of a good GaN insulator interface to improve current carrying capacity, and the epitaxial nature of the hetero-interface described here leads to an order of magnitude higher mobility for the electrons in the 2DEG when accumulated.

According to one embodiment of the present invention, a FET device with a gate, source and drain area are defined upon the two layer InAlGaN/GaN material to produce a III-nitride HFET device. The source and drain regions may be formed according to known methods including ion implantation, etching to remove the barrier region over the source and drain regions and application of a low resistance ohmic contact formation process.

The resulting device features a near zero interface density of state, control of strain state of the barrier layer and a resulting lack of relaxation generated defects. The device is also characterized by low leakage in the gate contact and a high breakdown field from the barrier layer. As a result, a larger dielectric constant compared to conventional insulators such as $SiO_2$ and SiN is provided. The device also provides a degree of control over the density of the resulting 2DEG, permitting an increase in sheet charge by a factor of up to 2-4 times. Alternately, the device provides a control over the density of the 2DEG to produce a nominally off device. A larger bandgap from the barrier region results in a larger confinement barrier for the electrons in the 2DEG. The larger bandgap reduces the scattering cross-section of the electrons, and adds to their mobility. The density of the 2DEG in relation to layer thickness with a lattice matched InAlGaN barrier layer is greatly improved over conventional devices.

The large bandgaps are obtained without strain relaxation and thus result in better confinement of electrons and higher mobility of those electrons. In addition, the large bandgaps permit lower leakage through the gate due to the large Schottky barrier height of the metals used in conjunction with the GaN material. The high critical fields of the GaN material allow thin layers to withstand large voltages without dielectric breakdown. The dielectric constant of GaN materials is approximately 10, which is a factor of 2.5 times better than $SiO_2$.

Other features and advantages of the present invention will become apparent from the following description of the invention which refers to the accompanying drawings.

DETAILED DESCRIPTION OF THE PREFERRED EMBODIMENTS

Figure 1:
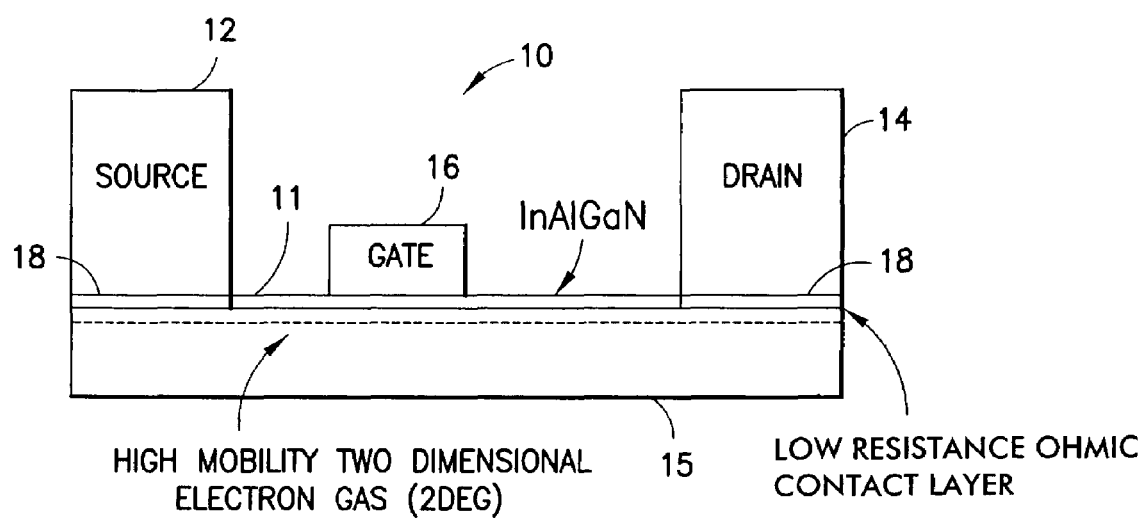
FIG. 1 is a schematic diagram of a device according to the present invention.

In the construction of GaN material devices, a number of factors impact the functionality and capability of the devices. A large lattice mismatch between GaN, AlN and InN and the strong piezoelectric and polarization effects in these materials significantly impact the electrical properties of III-nitride heterojunction devices. Nearly all reported GaN-based HEMTs to date use strained GaN-AlGaN junctions with alloy compositions that are designed to maximize the strain in the AlGaN layer, while simultaneously trying to avoid dislocations that may be responsible for long term instabilities in the devices. Various devices and systems for building heterojunction devices have been proposed to control the lattice mismatch and the strain of the GaN-AlGaN junctions. These devices are particularly designed to take advantage of piezoelectric and spontaneous polarization effects and to minimize long term instabilities.

HFETs typically have three terminals including a gate, a drain and a source terminal for controlling electrical power flow. An electrical potential applied to the gate terminal controls the flow of current from the drain terminal to the source terminal via an electrically conductive channel. The electrically conductive channel is defined by at least one heterointerface between two different semiconductor materials.

When AlGaN/GaN materials compose the semiconductor materials of the HFET, and AlGaN is used as a barrier layer, polarization charges resulting from the spontaneous polarization properties of AlGaN as well as strain induced characteristics known as piezoelectric polarization fields are present. The control of the formation of these fields in the construction of an HFET leads to different characteristics that make GaN-based HFETs suitable for a wide variety of applications depending upon how the device is characterized.

HFETs formed with GaN materials typically include a barrier layer of AlGaN that is disposed on the channel layer to induce a high concentration of electrons in the channel and thereby enhance the electrically conductive properties of the channel. However, the AlGaN barrier disposed on top of the channel can make ohmic contact with the channel difficult. In addition, the polarized nature of the AlGaN layer disposed on top of the channel results in the formation of surface charges that adversely affect the operation of the HFET. Further, HFETs formed with an AlGaN layer on top of the channel layers exhibit trapping effects where electrons migrate from the channel to the AlGaN layer and become trapped.

One solution to the above drawbacks is to provide a barrier layer disposed between a buffer layer and a channel layer in a GaN-based HFET. The polarization charges associated with the barrier layer create a potential barrier that prevents electrons from flowing out of the channel and into the buffer. However, this solution realized with AlGaN/GaN interfaces produces the same difficulties discussed above with respect to AlGaN/GaN materials for high current capacity, for example.

The use of InGaN alloys in the channel layer of HEMT devices is also known to permit the use of lower concentrations of Al in AlGaN layers to obtain equivalent levels of strain and piezoelectric characteristics for AlGaN/GaN heterostructures. InGaN provides a large a-lattice constant in relation to GaN, and low Al and In content layers may be used to produce AlGaN/InGaN heterostructures with comparable strain to AlGaN/GaN. High density 2DEGs may be generated based on the strain characteristics of the interface resulting in piezoelectric polarization that could be used to form and control the 2DEG with piezoelectric polarization fields. The density of the 2DEG can be controlled by varying the alloy percentage of Al. Accordingly, AlGaN/InGaN heterostructures with reduced Al content AlGaN layers may be provided without significant reductions in piezoelectric properties of the channel layer. However, as noted above, the properties of a strained III-nitride material system prevent the realization of a high current carrying device with good insulator qualities.

The device according to the present invention produces an inversion or elimination of the strain generated fields that are the focus of study and control in traditional HFET technology, as discussed above. The devices of the present invention also incorporate useful characteristics of the spontaneous polarization fields present in the III-nitride materials. By controlling these fields, the devices according to the present invention improve the conduction characteristics of the device, while enhancing the insulator qualities permitted by the materials. These results are achieved by controlling the in-plane lattice constant of the materials forming an interface in the III-nitride material system to produce devices that can be either nominally on or nominally off. In one embodiment, a GaN layer or substrate is provided as a basis, over which a layer of InAlGaN is grown with a particular relationship for the in-plane lattice constant of the two materials. So, for example, a nominally on HFET has an in-plane lattice constant for the material interface that is substantially the same in the GaN layer as in the InAlGaN layer. For nominally off devices, the in-plane lattice constant of the InAlGaN is larger than that of the GaN material.

This approach deviates from the conventional methodology for HFET design using the AlGaN/GaN material system, where the in-plane lattice constant of the AlGaN is made as small as possible nearing the point at which relaxation occurs.

In accordance with the present invention, a base layer is formed that is composed of a III-nitride material with a lattice constant A and a bandgap Eb, typically associated with GaN. A second layer is formed over the first layer, and is composed of a III-nitride material with a lattice constant B and bandgap Et, such as an alloy typified by InAlGaN. The formation of the two layers is controlled so that the resultant interface has specific characteristics dependent upon desired device parameters. For example, bandgap Et may be made greater than bandgap Eb and lattice constant B may be made greater than or equal to lattice constant A. A device provided in accordance with these relationships controls the spontaneous polarization produced in the materials to generate spontaneous polarization fields that can produce and control the 2DEG at the GaN/InAlGaN interface. Varying the alloy percentage of In to Al can control the density of the 2DEG. The spontaneous and piezoelectric polarization fields can be balanced to cancel each other, leading to zero charge accumulation at the interface, resulting in a nominally off HFET device.

Referring to FIG. 1, a semiconductor structure 10 illustrates the use of an InAlGaN/GaN interface in accordance with the present invention. Semiconductor structure 10 incorporates a quaternary barrier design with a source 12 and a drain 14. A gate 16 controls the formation and density of the high mobility 2DEG between source 12 and drain 14 to permit or prevent conduction. Source 12, drain 14 and gate 16 may be defined and metallized according to known III-nitride HFET methodologies. The formative methodologies may include ion implantation of impurities to form source 12 and drain 14, in addition to etching to remove barrier regions over source 12 and drain 14. Other methodologies applicable to the present invention may include the process of forming a low resistive ohmic contact 18 for source 12 and drain 14.

By providing a matching in-plane lattice constant between InAlGaN layer 11 and GaN layer 15, semiconductor structure 10 achieves a near zero interface density of state. The characteristics of the HFET layer structure permit control of the strain state of the barrier layer, reducing or eliminating relaxation generated defects and providing low leakage in the gate contact. The HFET produced according to semiconductor structure 10 exhibits a high breakdown field resulting from the barrier layer and the large dielectric constant achieved as an improvement over traditional insulator materials. Through control of the density of the 2DEG, semiconductor structure 10 provides an increase in sheet charge by a factor of 2-4 times that of conventional devices. With respect to a nominally off device arranged according to semiconductor structure 10, control of the density of the 2DEG permits a large withstand capability. The barrier region of semiconductor structure 10 has a large bandgap, which results in a large confinement barrier for electrons in the 2DEG. This phenomena reduces the scattering cross-section of the electrons and increases their mobility, leading to higher current densities and reduced ON resistance.

The thickness of layer 11 can vary in semiconductor structure 10, so that layer 11 has a different thickness under source 12 or drain 14 than under gate 16, for example. The different thickness of layer 11 can contribute to reducing leakage and assist in forming a good ohmic contact 18.

Figure 2:
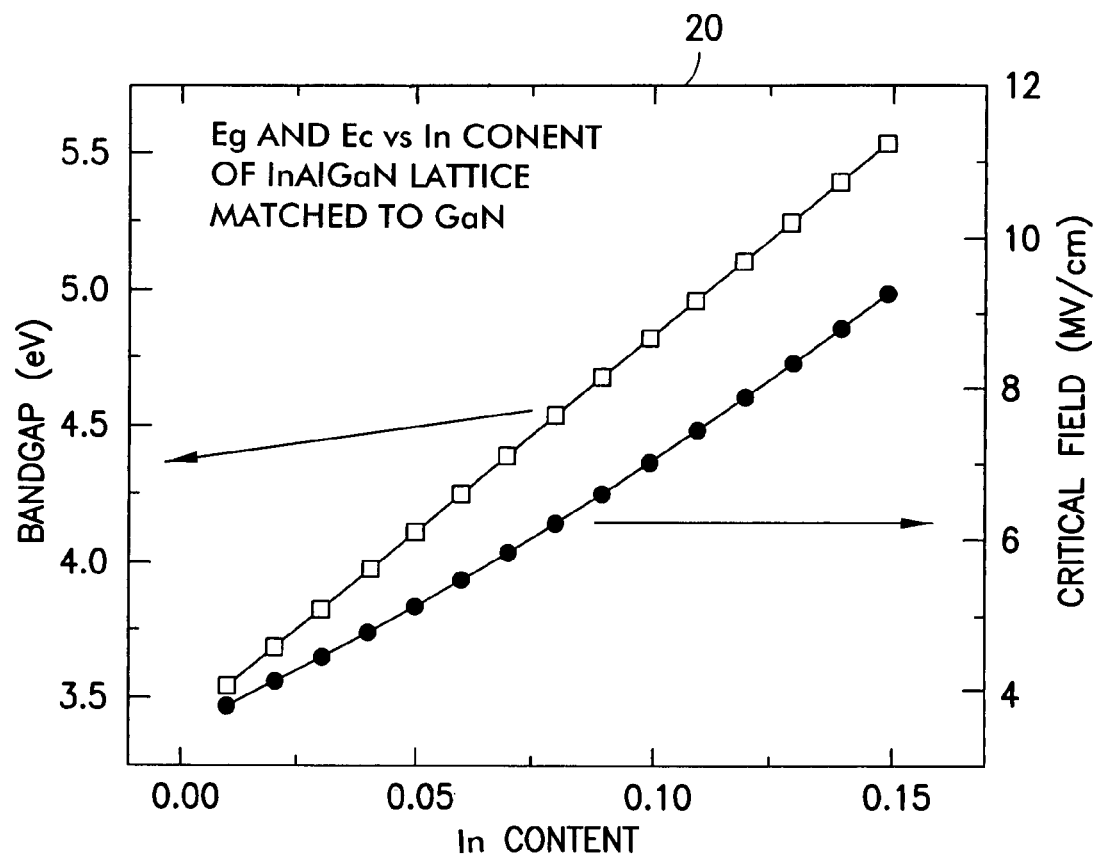
FIG. 2 is a graph illustrating bandgap and critical field in relation to In material content.

Referring to FIG. 2, bandgap and critical field values of semiconductor structure 10 in relation to In content are graphically illustrated in graph 20. The plotted bandgaps reflect the lattice matched barrier layer stoichiometry of the InAlGaN barrier layers and GaN layer. The large bandgaps illustrated are obtained without strain relaxation, resulting in better confinement of electrons and higher mobility of the confined electrons. In addition, the large bandgaps permits lower leakage through the gate electrode due to the large Schottky barrier height of the metals on InAlGaN. Graph 20 also illustrates the high critical fields of the InAlGaN material, permitting thin layers of material to stand off large voltages without dielectric breakdown. InAlGaN provides a dielectric constant of approximately 10, a factor of 2.5 times better than that of silicon oxide.

Figure 3:
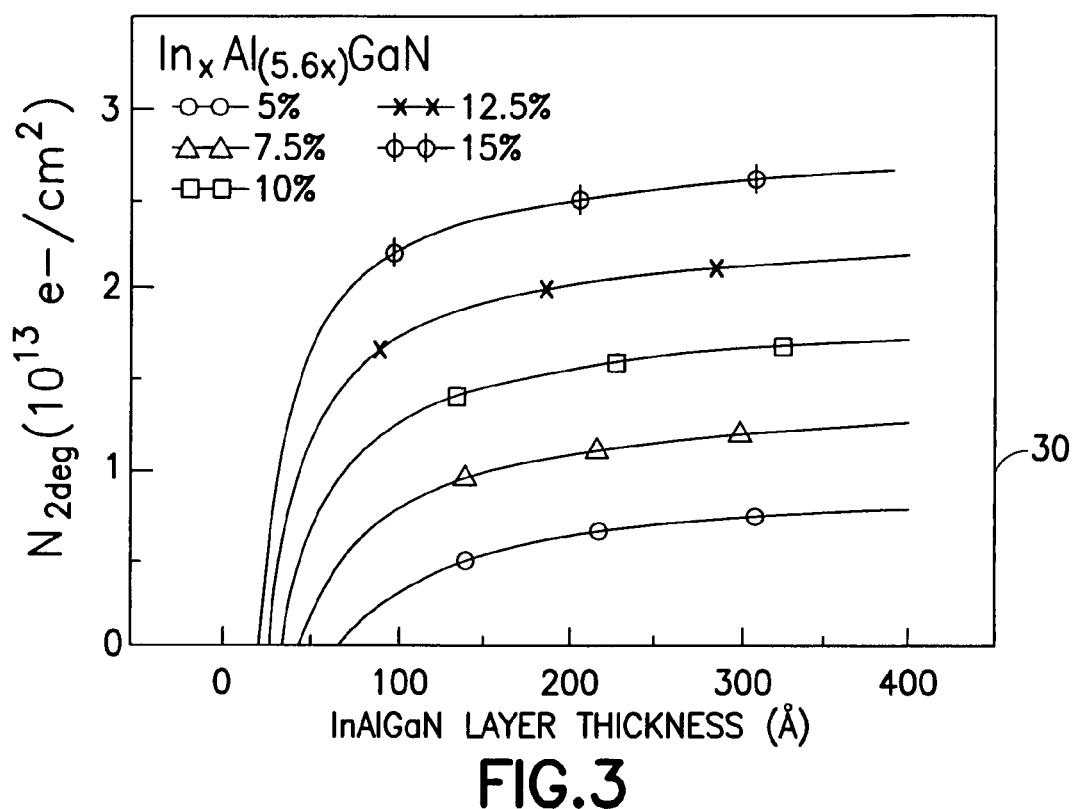
FIG. 3 is a graph illustrating density of 2DEG related to InAlGaN layer thickness.

Referring now to FIG. 3, calculations of the density of the 2DEG obtained through the structure according to the present invention are illustrated in graph 30. Graph 30 illustrates the calculated 2DEG density versus layer thickness for the lattice matched InAlGaN barrier layers. The illustrated figures represent a marked improvement over conventional AlGaN devices. For example, a 10% alloy with a thickness of 200 Å has a 2DEG density of approximately $1.5 \times 10^{13}$ E/cm$^2$, while previously produced AlGaN devices achieve at best a density of $1 \times 10^{13}$ E/cm$^2$.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A III-nitride device, comprising:
a first layer composed of a first III-nitride material having a first composition;
a second layer composed of a second III-nitride material having a second composition different from the first composition, the second layer being disposed in contact with the first layer;
an interface formed by the first and second layers providing a two dimensional electron gas for carrying electrical current; and
the first and second layers being formed such that the lattice constants in the plane of the interface of the first and second layers are approximately the same.

2. The device according to claim 1, wherein one of the first or second III-nitride material is GaN.

3. The device according to claim 2, wherein the other of the first or second III-nitride material is InAlGaN.

4. The device according to claim 2, wherein the GaN material has a bandgap that is less than that of the other of the first or second III-nitride materials.

5. The device according to claim 3, wherein the InAlGaN material has a bandgap that is greater than that of the GaN material.

6. The device according to claim 1, wherein the first III-nitride material and the second III-nitride material have different bandgaps.

7. A field effect transistor, comprising:
a source, a gate and a drain electrode, wherein a channel between the source and drain electrode is controlled by the gate electrode;
the channel being formed by a two dimensional electron gas obtained at an interface of two III-nitride materials having differing compositions;
one of the III-nitride materials having a lattice constant A, and the other of the III-nitride materials having a lattice constant B; and
the III-nitride materials being formed to produce a relationship between constants A and B wherein constant B is greater than or equal to constant A.

8. The transistor according to claim 7, wherein the III-nitride material with lattice constant B has a different thickness under the gate electrode than under the source or drain electrodes.

9. The transistor according to claim 8, wherein the III-nitride material with lattice constant B forms a good ohmic contact.

10. The transistor according to claim 7, wherein one of the III-nitride materials is GaN, and the other of the III-nitride materials is InAlGaN.

11. The transistor according to claim 7, wherein the relationship between constant A and constant B tends to balance spontaneous polarization fields and piezoelectric polarization fields near the interface, whereby the interface has zero charge accumulation.

12. The transistor according to claim 7, wherein the relationship between constant A and constant B is provided to control the generation of spontaneous polarization fields and piezoelectric polarization fields.

13. The transistor according to claim 7, wherein the III-nitride materials each have a bandgap value, where one of the III-nitride materials has a bandgap value that is greater than that of the other III-nitride material.

14. The transistor according to claim 12, wherein the III-nitride material with a bandgap value greater than that of the other III-nitride material is InAlGaN.

15. A III-nitride device, comprising:
a first layer composed of a first III-nitride material having a first composition;
a second layer composed of a second III-nitride material having a second composition different from the first composition, the second layer being disposed in contact with the first layer;
whereby the interface between the first and second layers is such that the spontaneous and piezoelectric polarization substantially cancel one another, whereby there is substantially no net charge at the interface.

16. The device of claim 15, wherein the bandgap for one of the first or second III-nitride materials is greater that than of the other.

* * * * *